(12) United States Patent
Mishima

(10) Patent No.: US 7,622,862 B2
(45) Date of Patent: Nov. 24, 2009

(54) LIGHT-EMITTING DEVICE WITH WATER-AND/OR OXYGEN-ABSORBING LAYER AND ITS PRODUCTION

(75) Inventor: Masayuki Mishima, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/640,670

(22) Filed: Aug. 14, 2003

(65) Prior Publication Data

US 2004/0046496 A1 Mar. 11, 2004

(30) Foreign Application Priority Data

Aug. 14, 2002 (JP) .............................. 2002-236365

(51) Int. Cl.
*H01J 1/62* (2006.01)
*H01J 63/04* (2006.01)

(52) U.S. Cl. ...................... 313/506; 313/498; 313/504; 313/512

(58) Field of Classification Search ................ 313/504, 313/498, 502, 506, 512; 428/690, 917
See application file for complete search history.

(56) References Cited

U.S. PATENT DOCUMENTS

| | | | |
|---|---|---|---|
| 4,357,557 A * | 11/1982 | Inohara et al. .............. 313/509 |
| 5,834,893 A | 11/1998 | Bulovic et al. | |
| 5,882,761 A | 3/1999 | Kawami et al. | |
| 5,962,962 A | 10/1999 | Fujita et al. | |
| 5,969,474 A | 10/1999 | Arai | |
| 5,990,615 A * | 11/1999 | Sakaguchi et al. .......... 313/504 |
| 6,624,568 B2 | 9/2003 | Silvernail | |
| 6,737,176 B1 * | 5/2004 | Otsuki et al. ................ 428/690 |
| 6,762,554 B2 * | 7/2004 | Jou et al. .................... 313/512 |
| 2002/0070663 A1 * | 6/2002 | Ogura et al. ................ 313/506 |
| 2002/0132384 A1 * | 9/2002 | Cheng et al. .................. 438/29 |
| 2002/0134984 A1 * | 9/2002 | Igarashi ....................... 257/79 |
| 2003/0008405 A1 * | 1/2003 | Lippard et al. ................ 436/73 |
| 2003/0113579 A1 * | 6/2003 | Sotoyama et al. ........... 428/690 |
| 2003/0184221 A1 | 10/2003 | Mishima | |
| 2004/0081836 A1 * | 4/2004 | Inoue et al. ................. 428/469 |

FOREIGN PATENT DOCUMENTS

| | | |
|---|---|---|
| JP | 9-148066 A | 6/1997 |
| JP | 2002-8852 A | 1/2002 |

* cited by examiner

*Primary Examiner*—Toan Ton
*Assistant Examiner*—Kevin Quarterman
(74) *Attorney, Agent, or Firm*—Birch, Stewart, Kolasch & Birch, LLP

(57) ABSTRACT

A light-emitting device comprises a laminate structure having an anode substrate, an anode, at least one organic layer comprising a light-emitting layer, a cathode and a cathode substrate in this order, wherein a water- and/or oxygen-absorbing layer is located between the cathode substrate and the cathode.

10 Claims, 3 Drawing Sheets

LIGHT-EMITTING DEVICE WITH WATER-AND/OR OXYGEN-ABSORBING LAYER AND ITS PRODUCTION

This nonprovisional application claims priority under 35 U.S.C. § 119(a) on Patent Application No(s). 2002-236365 filed in Japan on Aug. 14, 2002, which is(are) herein incorporated by reference.

FIELD OF THE INVENTION

The present invention relates to a light-emitting device, preferably an organic electroluminescence (EL) device, effectively usable for flat panel light sources such as full-color display devices, backlights and illumination light sources, light source arrays of printers, etc., and particularly to a light-emitting device having excellent brightness of emitted light and durability, and a method for producing such a light-emitting device.

BACKGROUND OF THE INVENTION

Organic light-emitting device using organic substances are categorized to a coated type and a vapor-deposited type, though both fail to have sufficient durability. One of the significant factors is water. When water exists in the light-emitting device, water is decomposed to oxygen and hydrogen by electrolysis, and the generation of oxygen and hydrogen deteriorates the durability of the light-emitting device. The reaction of water with a cathode also causes the deterioration of durability.

Proposed as a means for removing water is a dryer disposed in a sealing element (JP 9-148066 A). Though this means can remove water in an atmosphere, it fails to remove water in a substrate or an organic layer. JP 2002-8852 A proposes that an alkali or alkaline earth metal is disposed in a sealed space of the light-emitting device. However, these metals are unstable because of extremely high reactivity to water and oxygen, thereby failing to provide the light-emitting device with stable durability. Accordingly, it is strongly desired in this technical field to deprive the light-emitting device of a sealed space as much as possible and remove water from the device as completely as possible.

OBJECTS OF THE INVENTION

Accordingly, an object of the present invention is to provide a light-emitting device having excellent durability and brightness of light emitted, which is effectively usable for flat panel light sources such as full-color display devices, backlights and illumination light sources, light source arrays of printers, etc.

Another object of the present invention is to provide a method for producing such a light-emitting device.

SUMMARY OF THE INVENTION

As a result of intensive research in view of the above objects, the inventor have found that (a) a light-emitting device excellent in durability and the brightness of light emitted is obtained by forming a water- and/or oxygen-absorbing layer comprising an oxide having a reducing function, etc., between a cathode and a cathode substrate; and that (b) the light-emitting device having the above structure is efficiently produced by providing a partial laminate comprising a water- and/or oxygen-absorbing layer formed between a cathode and a cathode substrate, and then bonding the partial laminate to the remaining layers. The present invention has been accomplished based on this finding.

Thus, the light-emitting device of the present invention comprises a laminate structure having an anode substrate, an anode, at least one organic layer comprising a light-emitting layer, a cathode and a cathode substrate in this order, wherein a water- and/or oxygen-absorbing layer is formed between the cathode substrate and the cathode.

In the above light-emitting device, the laminate structure preferably has a bonding structure between at least one of pairs of the anode and the organic layer, the organic layer and the cathode, and part of the organic layers and the remaining organic layer or layers.

The water- and/or oxygen-absorbing layer preferably comprises a reducing metal oxide. The reducing metal oxide is preferably at least one selected from the group consisting of SiO, GeO, SnO and FeO.

The water- and/or oxygen-absorbing layer preferably comprises a metal or an alloy having a work function of 4.0 eV or less.

The method for producing the above light-emitting device according to the present invention comprises the step of producing the light-emitting device by laminating (a) a substructure containing the anode substrate and the anode to a substructure containing the cathode substrate, the at least one water- and/or oxygen-absorbing layer, the cathode and the organic layer, (b) a substructure containing the anode substrate, the anode and the organic layer to a substructure containing the cathode substrate, the at least one water- and/or oxygen-absorbing layer and the cathode, or (c) a substructure containing the anode substrate, the anode and part of the organic layer to a substructure containing the cathode substrate, the at least one water- and/or oxygen-absorbing layer, the cathode and the remaining organic layer.

DETAILED DESCRIPTION OF THE PREFERRED EMBODIMENTS

The light-emitting device of the present invention comprises an anode substrate, an anode, at least one organic layer comprising a light-emitting layer, a cathode, a water- and/or oxygen-absorbing layer, and a cathode substrate in this order. The term "water- and/or oxygen-absorbing layer" may be expressed in a simplified manner as "water- and/or oxygen-absorbing layer."

Figure 1:
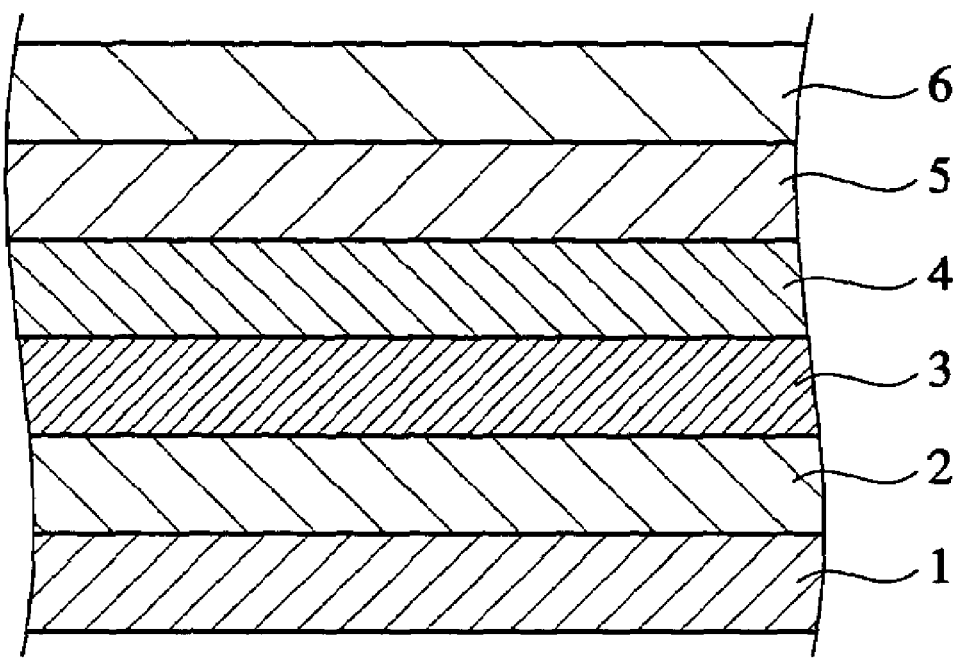
FIG. 1 is a partial cross-sectional view showing a light-emitting device according to a preferred embodiment of the present invention.

FIG. 1 is a schematic cross-sectional view showing one example of the light-emitting device of the present invention. The light-emitting device comprises an anode substrate 1, an anode 2, an organic layer 3, a cathode 4, a water- and/or oxygen-absorbing layer 5, and a cathode substrate 6. The water- and/or oxygen-absorbing layer 5 is formed between the cathode substrate 6 and the cathode 4. The layer structure of the light-emitting device of the present invention will be explained in detail below.

[1] Water- and/or Oxygen-absorbing Layer (a) Material

Materials used for the water- and/or oxygen-absorbing layer of the present invention are preferably reducing metal oxides, or metals or alloys having a work function of 4.0 eV or less.

The term "reducing metal oxide" used herein means an oxide in which an atom bonded to oxygen has a smaller oxidation number than its valency. Examples of the reducing metal oxides usable for the water- and/or oxygen-absorbing layer include SiO, GeO, SnO, FeO, MnO and WO. Preferable among them are SiO, GeO, SnO and FeO.

Examples of the metals and alloys having a work function of 4.0 eV or less include metals such as Ca, Ce, Cs, Er, Eu, Gd, Hf, K, La, Li, Mg, Nd, Rb, Sc, Sm, Y, Yb, Zn, etc., and alloys comprising these metals as main components. Among them, Ca, Li, Mg and alloys thereof are preferably used from the aspects of availability and easy treatment.

Figure 6:
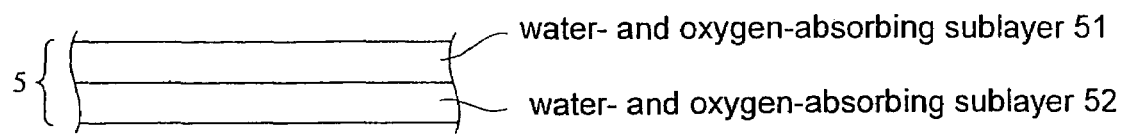
FIG. 6 is a partial cross-sectional view showing a water- and/or oxygen-absorbing layer composed of two sublayers according to an embodiment of the present invention.

The reducing metal oxides, and the metals or alloys having a work function of 4.0 eV or less, may be used in combination as materials for the water- and/or oxygen-absorbing layer. In this case, the water- and/or oxygen-absorbing layer may be composed of a plurality of sublayers, or of one layer in which both of them are dispersed. FIG. 6 shows a water- and/or oxygen-absorbing layer 5 composed of a water- and/or oxygen-absorbing sublayer 51 and a water- and/or oxygen-absorbing sublayer 52.

(b) Forming Method

The water- and/or oxygen-absorbing layer 5 is formed between the cathode substrate 6 and the cathode 4. In this structure, water and/or oxygen contained in the substrate and those intruding into the device are efficiently absorbed, providing the light-emitting device with improved durability and brightness of light emitted.

Though not restrictive, the formation of the water- and/or oxygen-absorbing layer is carried out preferably by a vapor deposition method or a sputtering method. It is preferably the same method as used for forming the cathode for the purpose of simplifying the process, because the cathode is formed continuously after the formation of the water- and/or oxygen-absorbing layer. Layers such as an insulating layer, etc. may be formed between the water- and/or oxygen-absorbing layer, and the cathode or the cathode substrate.

The thickness of the water- and/or oxygen-absorbing layer is not restrictive as long as the absorbing layer contains the reducing metal oxides and/or the metals or alloys having a work function of 4.0 eV or less, which absorb a sufficient amount of water and/or oxygen to improve the durability of the light-emitting device. The absorbing layer preferably has a thickness of 10 nm or more and 1 μm or less, more preferably 50 nm or more and 500 nm or less. When the thickness of the absorbing layer is less than 10 nm, it undesirably fails to absorb sufficient water. On the other hand, when the thickness of the absorbing layer exceeds 1 μm, the formation of the absorbing layer takes too much time, undesirably being likely to cause separation of the absorbing layer from the cathode substrate or the cathode.

[2] Layer Structure of Light-emitting Device

The light-emitting device of the present invention comprises an anode substrate, an anode, an organic layer, a cathode, a water- and/or oxygen-absorbing layer and a cathode substrate in this order. The organic layer preferably comprises an electron-transporting layer, a hole-transporting layer, etc., in addition to at least one light-emitting layer. Examples of laminating positions or laminating interfaces (represented by "//") in the laminate structure are (a) anode substrate/anode//organic layer or layers/cathode/water- and/or oxygen-absorbing layer/cathode substrate, or (b) anode substrate/anode/organic layer or layers//cathode/water- and/or oxygen-absorbing layer/cathode substrate, etc. A laminating interface may exist in the organic layers. Namely, part of the organic layers may be laminated to the remaining organic layer or layers. The organic layer may contain a polymer binder (binder resin) to secure the bonding. Explanation will be made below specifically on a case where a laminating interface exists in the organic layers.

Figure 2:
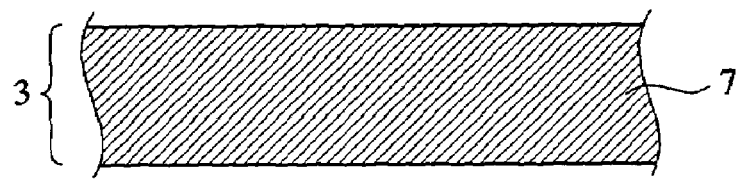
FIG. 2 is a partial cross-sectional view showing one example of an organic layer in the light-emitting device.
Figure 3:
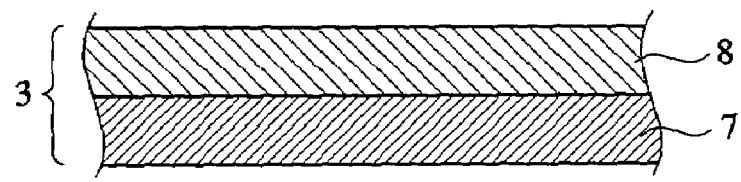
FIG. 3 is a partial cross-sectional view showing another example of an organic layer in the light-emitting device.
Figure 4:
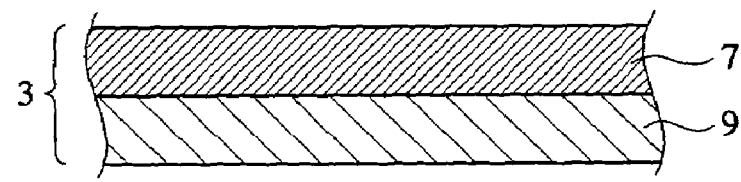
FIG. 4 is a partial cross-sectional view showing a further example of an organic layer in the light-emitting device.

FIGS. 2 to 5 are schematic cross-sectional views showing examples of the organic layers 3 used in the present invention. FIG. 2 is a schematic cross-sectional view showing an organic layer 3 constituted by a light-emitting layer 7 alone. In this case, the laminate structure comprising the laminate interface (//) may be (anode substrate/anode/light-emitting layer//light-emitting layer/cathode/water- and/or oxygen-absorbing layer/cathode substrate). FIG. 3 is a schematic cross-sectional view showing an organic layer 3 comprising a light-emitting layer 7 and an electron-transporting layer 8. In this case, the laminate structure comprising the laminate interface (//) may be (anode substrate/anode/light-emitting layer//electron-transporting layer/cathode/water- and/or oxygen-absorbing layer/cathode substrate). FIG. 4 is a schematic cross-sectional view showing an organic layer 3 having two layers of a hole-transporting layer 9 and a light-emitting layer 7. In this case, the laminate structure comprising the laminate interface (//) may be (anode substrate/anode/hole-transporting layer//light-emitting layer/cathode/water- and/or oxygen-absorbing layer/cathode substrate).

Figure 5:
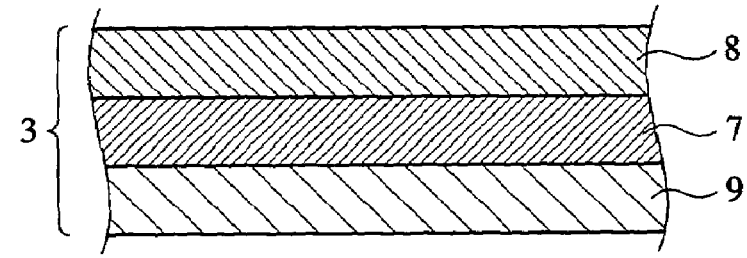
FIG. 5 is a partial cross-sectional view showing a still further example of an organic layer in the light-emitting device.

FIG. 5 is a schematic cross-sectional view showing an organic layer 3 having three layers of a hole-transporting layer 9, a light-emitting layer 7 and an electron-transporting layer 8. In this case, the laminate structure comprising the laminate interface (//) may be (anode substrate/anode/hole-transporting layer//light-emitting layer/electron-transporting layer/cathode/water- and/or oxygen-absorbing layer/cathode substrate), or (anode substrate/anode/hole-transporting layer/light-emitting layer//electron-transporting layer/cathode/water- and/or oxygen-absorbing layer/cathode substrate).

[3] Production Method

The method for producing the light-emitting device of the present invention comprises a step in which (a) an anode is laminated to the remaining layers (organic layer, cathode, water- and/or oxygen-absorbing layer and cathode substrate); (b) a cathode is laminated to the remaining layers (organic layer, anode and anode substrate); or (c) an organic layer is formed on each of an anode and a cathode, and the organic layer on the anode is laminated to the organic layer on the cathode. In the case (c), it is properly selected at which interface the organic layers should be laminated. By using a bonding method, an unnecessary sealed space is not provided in the laminate interface, thereby providing not only the advantage of improved durability, but also the efficient, low-cost production of a large-area, light-emitting device. Usable as a bonding method is a method for laminating the interface between two layers by adhesion, pressure bonding, fusion, etc. Heating and/or pressing are preferably carried out while laminating. Heating and pressing may be carried out alone or in combination.

Heating may be carried out by a means generally used, and heating means such as a laminator, an infrared heater, a roller heater, a laser, a thermal head, etc. may be used. In the case of large-area bonding, surface-heating means are preferable, and a laminator, an infrared heater, a roller heater, etc. are more preferable. The laminating temperature may vary depending on the materials of the organic layer and the heating member. It is, however, preferably 40° C. to 250° C., more preferably 50° C. to 200° C., particularly 60° C. to 180° C. It should be noted that a preferred range of the laminating temperature is related to the heat resistance of the heating member, the material and the substrate, meaning that as the heat resistance increases, the laminating temperature is elevated accordingly.

Though a pressing means is not particularly restrictive, those capable of conducting uniform pressing are preferable when a substrate such as glass, etc., which is easily broken by strain, is used. For instance, a pair of rollers, one or both of which are made of rubber, are preferable, specifically, a laminator such as First Laminator VA-400III available from TAISEI LAMINATOR CO. LTD., a thermal head of a thermal transfer printer, etc. is usable.

[4] Materials for Each Layer

Materials used in the light-emitting device of the present invention will be explained in detail below.

(a) Anode Substrate (Anode Support)

Specific examples of materials for the anode substrate used in the present invention include inorganic materials such as yttrium-stabilized zirconia (YSZ) and glass; organic materials such as polyesters (polyethylene terephthalate, polybutylene terephthalate, polyethylene naphthalate, etc.), polystyrenes, polycarbonates, polyether sulfone, polyarylates, polyimides, polycycloolefins, norbomene resins, poly (chlorotrifluoroethylene), etc. Preferable among the organic materials are those having excellent heat resistance, dimensional stability, solvent resistance, electric insulation and workability.

The shape, structure and size of the anode substrate may be appropriately determined in accordance with purposes and applications of the light-emitting device. The anode substrate is generally in a shape of plate or sheet. The anode substrate may have a single-layer structure or a multi-layer structure. The anode substrate may be composed of one member or a plurality of members.

The anode substrate may be transparent or opaque. A moisture permeation-inhibiting layer (gas barrier layer) may be formed on a front surface or a rear surface (on the transparent anode side) of the anode substrate. The gas barrier layer is preferably made of an inorganic compound such as silicon nitride, silicon oxide, etc. The gas barrier layer can be formed by a radio frequency sputtering method, etc. Further, a hard coating layer, an undercoating layer, etc. may be formed on the anode substrate, if necessary.

The anode substrate preferably has a linear thermal expansion coefficient of 20 ppm/° C. or less. The thermal expansion coefficient can be measured by a method of heating a sample at a constant speed to detect the change of its length, for instance, by a TMA method. When the linear thermal expansion coefficient is larger than 20 ppm/° C., the peeling of the electrodes and the organic layer is likely to occur by heat at the time of laminating or during use, etc., resulting in the deterioration of durability.

The anode substrate has water permeability of preferably 0.1 g/m$^2$·day or less, more preferably 0.05 g/m$^2$·day or less, particularly 0.01 g/m$^2$·day or less. Its oxygen permeability is preferably 0.1 m/m$^2$·day·atm or less, more preferably 0.05 ml/m$^2$day·atm or less, particularly 0.01 ml/m$^2$·day·atm or less. The water permeability can be measured according to a method of JIS K7129; 1992 method (mainly MOCON method). The oxygen permeability can be measured by a method (mainly MOCON method) according to JIS K7126; 1987. With this, it is possible to prevent the intrusion of water and oxygen causing the deterioration of durability into the light-emitting device.

(b) Anode

The shape, structure and size of an anode is not restrictive as far as an anode functions to supply holes to the organic layer, and may be properly selected from known electrodes in accordance with the applications and purposes of the light-emitting device.

The anode may be made of metals, alloys, metal oxides, electrically conductive organic compounds, mixtures thereof, etc. The anode is preferably made of a material having a work function of 4.0 eV or more. Examples of the materials for the anode include doped tin oxides such as antimony-doped tin oxide (ATO), fluorine-doped tin oxide (FTO); semiconductive metal oxides such as tin oxide, zinc oxide, indium oxide, indium tin oxide (ITO) and indium zinc oxide (IZO); metals such as gold, silver, chromium and nickel; mixtures and laminates of the metals and conductive metal oxides; inorganic conductive compounds such as copper iodide and copper sulfide; dispersion of semiconductive metal oxides or metal compounds; conductive organic compounds such as polyaniline, polythiophene and polypyrrole; laminates of conductive organic compounds and ITO; etc.

In the present invention, the anode is formed on the substrate or on the organic layer by the method appropriately selected from physical methods such as a vacuum deposition method, a sputtering method and an ion-plating method; chemical methods such as a CVD method and a plasma CVD method; etc., depending on the materials used therefor. When the anode material is ITO, the anode may be formed by a method such as a DC sputtering method, a radio frequency sputtering method, a vacuum deposition method, an ion-plating method, etc.

The patterning of the anode may be conducted by a chemical etching method such as a photolithography method or a physical etching method using laser beams, etc. In addition, the anode may be patterned by vacuum vapor deposition or sputtering with a mask, a lift-off method, a printing method, etc.

The thickness of the anode may be properly controlled depending on the material used therefor. Though not particularly limited, the thickness of the anode is generally 10 nm to 50 μm, preferably 50 nm to 20 μm. The resistance of the anode is preferably 10$^6$ Ω/square or less, more preferably 10$^5$ Ω/square or less. When the resistance of the anode is 10$^5$ Ω/square or less, the formation of bus line electrodes can provide a large-area, light-emitting device with excellent performance. The anode may be colorless transparent or colored transparent. The light transmittance of the anode is preferably 60% or more, more preferably 70% or more, to allow light emission from the anode side. The light transmittance can be measured by a known method using a spectrophotometer.

(c) Cathode Substrate (Cathode Support)

Specific examples of materials for the cathode substrate used in the present invention include inorganic materials such as yttrium-stabilized zirconia (YSZ) and glass; organic materials such as polyesters (polyethylene terephthalate, polybutylene terephthalate, polyethylene naphthalate, etc.), polystyrenes, polycarbonates, polyether sulfone, polyarylates, polyimides, polycycloolefins, norbomene resins, poly (chlorotrifluoroethylene), etc. Preferable among the organic materials are those having excellent heat resistance, dimensional stability, solvent resistance, electric insulation and workability.

The shape, structure and size of the cathode substrate may be appropriately determined in accordance with purposes and applications of the light-emitting device. The cathode substrate is generally in a shape of plate or sheet. The cathode substrate may have a single-layer structure or a multi-layer structure. The cathode substrate may be composed of one member or a plurality of members.

The cathode substrate may be transparent or opaque. When the cathode substrate is opaque, the cathode substrate preferably has a substrate support constituted by a metal foil provided with an insulating layer on one or both surfaces. Though not particularly restrictive, the metal foil may be an aluminum foil, a copper foil, a stainless steel foil, a gold foil, a silver foil, etc. Preferable among them from the aspects of the easiness of working and cost are an aluminum foil and a copper foil. Though not particularly restrictive, the insulating layer may be made of, for instance, inorganic materials such as inorganic oxides, inorganic nitrides, etc.; plastics such as polyesters (polyethylene terephthalate, polybutylene terephthalate, polyethylene naphthalate, etc.), polystyrenes, polycarbonates, polyether sulfones, polyarylates, allyldiglycolcarbonates, polyimides, polycyclolefins, norbornene resins, poly (chlorotrifluoroethylene), etc.

The cathode substrate preferably has a linear thermal expansion coefficient of 20 ppm/° C. or less. The thermal expansion coefficient can be measured by a method of heating a sample at a constant speed to detect the change of its length, for instance, by a TMA method. When the linear thermal expansion coefficient is larger than 20 ppm/° C., the peeling of the electrodes and the organic layer is likely to occur by heat at the time of laminating or during use, etc., resulting in the deterioration of durability.

The insulating layer formed on the cathode substrate also preferably has a linear thermal expansion coefficient of 20 ppm/° C. or less. Materials for forming the insulating layer having a linear thermal expansion coefficient of 20 ppm/° C. or less are preferably metal oxides such as silicon oxide, germanium oxide, zinc oxide, aluminum oxide, titanium oxide, copper oxide; metal nitrides such as silicon nitride, germanium nitride, aluminum nitride, one or more of which may be combined. The inorganic insulating layer of metal oxides and/or metal nitrides preferably has a thickness of 10 nm to 1000 nm. When the inorganic insulating layer is thinner than 10 nm, it has too low insulation. On the other hand, when the inorganic insulating layer is thicker than 1000 nm, cracking is likely to occur, resulting in pinholes and thus lower insulation. The methods for forming an insulating layer of metal oxides and/or metal nitrides are not particularly restrictive, but dry methods such as a vapor deposition method, a sputtering method and a CVD method, wet methods such as a sol-gel method, coating methods of particles of metal oxides and/or metal nitrides dispersed in solvents, etc. may be used.

Particularly preferable as plastics having linear thermal expansion coefficients of 20 ppm/° C. or less are polyimides and liquid crystal polymers. The details of properties, etc. of these plastics are described in "Plastic Databook" edited by "Plastic" Editorial Department issued by Asahi Kasei AMIDAS, etc. When polyimides, etc. are used for an insulating layer, sheets of polyimides, etc. are preferably laminated with aluminum foils. Sheets of polyimides, etc. preferably have a thickness of 10 µm to 200 µm. When the sheet of polyimide, etc. is thinner than 10 µm, handling is difficult at the time of lamination. On the other hand, when the sheet of polyimide, etc. is thicker than 200 µm, it has poor flexibility, resulting in inconvenience in handling. The insulating layer may be attached to one or both sides of a metal foil. When it is attached to both sides, both sides may be metal oxides and/or metal nitrides, or both sides may be insulating layers of plastics such as polyimides. Alternatively, one side may be an insulating layer made of a metal oxide and/or a metal nitride, while the other side may be an insulating layer constituted by a polyimide sheet. Further, a hard coating layer and an undercoating layer may be formed, if necessary.

The cathode substrate has water permeability of preferably 0.1 g/m²·day or less, more preferably 0.05 g/m²·day or less, particularly 0.01 g/m²·day or less. Its oxygen permeability is preferably 0.1 ml/m²·day·atm or less, more preferably 0.05 ml/m² day·atm or less, particularly 0.01 ml/m²·day·atm or less. The water permeability can be measured according to a method of JIS K7129; 1992 (mainly MOCON method). The oxygen permeability can be measured by a method of JIS K7126; 1987 (mainly MOCON method). With this, it is possible to prevent the intrusion of water and oxygen causing the deterioration of durability into the light-emitting device.

(d) Cathode

The cathode usually is not restrictive with respect to shape, structure and size, as far as it functions to inject electrons into the organic layer, and may be properly selected from known electrodes in accordance with the applications and purposes of the light-emitting device.

The cathode may be made of metals, alloys, metal oxides, electrically conductive compounds, mixtures thereof, etc. The cathode is preferably made of a material having a work function of 4.5 eV or less. Examples of the materials used for the cathode include alkali metals such as Li, Na, K and Cs; alkaline earth metals such as Mg and Ca; gold; silver; lead; aluminum; a sodium-potassium alloy; a lithium-aluminum alloy; a magnesium-silver alloy; indium; rare earth metals such as ytterbium; etc. Although the materials may be used alone, the cathode is preferably made of a plurality of materials to improve both of stability and electron injection property.

Preferable among the above materials are alkali metals and alkaline earth metals from the viewpoint of the electron injection property, and aluminum-based materials from the viewpoint of stability during storage. Usable as the aluminum-based materials are aluminum itself and aluminum-based alloys and mixtures containing 0.01 to 10% by mass of alkali metals or alkaline earth metals, such as a lithium-aluminum alloy, a magnesium-aluminum alloy, etc.

Usable as materials for the cathode are described in detail in JP 2-15595 A, JP 5-121172 A, etc.

The formation method of the cathode is not restrictive, and known methods can be used, though it is carried out in a vacuum apparatus in the present invention. The method for forming the cathode on the substrate may be properly selected from, for instance, physical methods such as a vacuum deposition method, a sputtering method and an ion-plating method; chemical methods such as a CVD method and a plasma CVD method; etc., depending on the adaptability of the material to the cathode. In the case of using metals as materials for the cathode, one or a plurality of the metals may be sputtered simultaneously or successively.

The patterning of the cathode may be conducted by a chemical etching method such as a photolithography method or a physical etching method using laser beams, etc. In addition, the cathode may be patterned by vacuum vapor deposition or sputtering with a mask, a lift-off method, a printing method, etc.

Further, a dielectric layer may be formed between the cathode and the organic layer. The dielectric layer may be made of a fluoride of alkali or alkaline earth metal, having a thickness of 0.1 nm to 5 nm. The dielectric layer may be formed by a vacuum vapor deposition method, a sputtering method, an ion-plating method, etc.

The thickness of the cathode may be properly controlled depending on the material used therefor. Though not particularly limited, the thickness of the cathode is generally 10 nm to 5 µm, preferably 50 nm to 1 µm.

(e) Organic Layer

The organic layer used in the present invention is constituted by one or more organic layers, at least one of which is a light-emitting layer. It should be noted that when the term "derivatives" is used herein with respect to compounds used for the organic layers, it encompasses not only compounds per se but also their derivatives.

(A) Structure of Organic Layer

The organic layer may specifically have a single-layer structure constituted by a light-emitting layer alone, or a multi-layer structure such as a light-emitting layer/an electron-transporting layer, a hole-transporting layer/a light-emitting layer, a hole-transporting layer/a light-emitting layer/an electron-transporting layer, a light-emitting layer/an electron-transporting layer/an electron-injecting layer, a hole-injecting layer/a hole-transporting layer/a light-emitting layer/an electron-transporting layer/an electron-injecting layer, etc.

(B) Light-emitting Layer

The light-emitting layer used in the present invention comprises at least one light-emitting material, and may contain, if necessary, a hole-transporting material, an electron-transporting material and a host material. The light-emitting material is not restrictive as long as it is a fluorescent compound or a phosphorescent compound. Examples of the fluorescent compounds used in this invention include benzoxazole derivatives; benzoimidazole derivatives; benzothiazole derivatives; styrylbenzene derivatives; polyphenyl derivatives; diphenylbutadiene derivatives; tetraphenylbutadiene derivatives; naphthalimido derivatives; coumarin derivatives; perylene derivatives; perynone derivatives; oxadiazole derivatives; aldazine derivatives; pyralidine derivatives; cyclopentadiene derivatives; bis (styryl)anthracene derivatives; quinacridon derivatives; pyrrolopyridine derivatives; thiadiazolopyridine derivatives; styrylamine derivatives; aromatic dimethylidine compounds; metal complexes such as 8-quinolinol metal complexes and derivatives thereof and rare-earth metal complexes; polymer materials such as polythiophene derivatives, polyphenylene derivatives, polyphenylenevinylene derivatives and polyfluorene derivatives; etc. The fluorescent compounds may be used alone or in combination.

Though not particularly restrictive, the phosphorescent compounds are preferably ortho-metallated complexes or porphyrin metal complexes.

The ortho-metallated complexes used in the present invention may be such compounds that are described in Akio Yamamoto, "Metalorganic Chemistry, Foundation and Application," pages 150 to 232, Shokabo Publishing Co., Ltd., (1982) H. Yersin, "Photochemistry and Photophysics of Coordination Compounds," pages 71 to 77 and 135 to 146, Springer-Verlag, Inc. (1987) etc. The organic layer comprising such an ortho-metallated complex is advantageous in its excellent luminance and light-emitting efficiency.

There are various ligands forming the ortho-metallated complexes including those described in the above references. Preferable ligands among them include 2-phenylpyridine derivatives, 7,8-benzoquinoline derivatives, 2-(2-thienyl)pyridine derivatives, 2-(1-naphthyl)pyridine derivatives and 2-phenylquinoline derivatives, etc. If necessary, the derivatives may have substituents. The ortho-metallated complexes may have other ligands than the above ligands.

The ortho-metallated complexes used in the present invention may be synthesized by known methods disclosed in Inorg. Chem., 30, 1685, 1991; Inorg. Chem., 27, 3464, 1988; Inorg. Chem., 33, 545, 1994; Inorg. Chim. Acta, 181, 245, 1991; J. Organomet. Chem., 335, 293, 1987; J. Am. Chem. Soc., 107, 1431, 1985; etc. Preferable among the ortho-metallated complexes are compounds emitting light from triplet excitons from the aspect of improvement in light-emitting efficiency. Preferable among the porphyrin metal complexes is a porphyrin-platinum complex. The phosphorescent compounds may be used alone or in combination. The fluorescent compound and the phosphorescent compound may be used together. From the aspects of luminance and light-emitting efficiency, it is preferable to use the phosphorescent compound.

Though not restrictive, the hole-transporting materials may be low- or high-molecular-weight materials if they have any of functions of injecting holes from the anode, transporting holes and blocking electrons from the cathode. Examples of the hole-transporting materials include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stablemen derivatives, siloxane derivatives, aromatic tertiary amine compounds, styrylamine compounds, aromatic dimethylidine compounds, porphyrin compounds, pol silane compounds, poly (N-vinylcarbazole) derivatives, aniline copolymers, electrically conductive oligomers such as oligothiophenes, electrically conductive polymers such as polythiophene derivatives, polyphenylene derivatives, polyphenylenevinylene derivatives, polyfluorene derivatives, etc. These hole-transporting materials may be used alone or in combination. The content of the hole-transporting materials in the light-emitting layer is preferably 0 to 99.9% by mass, more preferably 0 to 80% by mass.

The electron-transporting materials are not particularly limited as long as they have any of functions of transporting electrons and blocking holes from the anode. Examples of the electron-transporting materials include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodimide derivatives, fluorenylidenemethane derivatives, distyrylpyrazine derivatives, anhydrides derived from heterocyclic tetracarboxylic acids having skeleton structures such as naphthaleneperylene, phthalocyanine derivatives, 8-quinolinol metal complexes and derivatives thereof, metallophthalocyanines, metal complexes containing a benzoxazole or benzothiazole ligand, aniline copolymers, electrically conductive oligomers such as oligothiophenes, electrically conductive polymers such as polythiophene derivatives, polyphenylene derivatives, polyphenylenevinylene derivatives, polyfluorene derivatives, etc. The content of the electron-transporting materials in the light-emitting layer is preferably 0 to 99.9% by mass, more preferably 0 to 80% by mass.

The host compound is a compound causing energy transfer from its excited state to the light-emitting compound, resulting in accelerating the light emission of a light-emitting compound such as a fluorescent compound and a phosphorescent compound. The host materials may be appropriately selected depending on the purposes without particular restrictions, as long as they are compounds capable of moving exciton energy to the light-emitting materials. Specific examples of the host compounds include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, anthraquinodimethane derivatives, anthrone derivatives, diphenylquinone derivatives, thiopyran dioxide derivatives, carbodimide derivatives, fluorenylidenemethane derivatives, distyrylpyrazine derivatives, anhydrides derived from heterocyclic tetracarboxylic acids having skeleton structures such as naphthaleneperylene, phthalocyanine derivatives, 8-quinolinol metal complexes and derivatives thereof, metallophthalocyanines, metal complexes containing a benzoxazole or benzothiazole ligand, polysilane compounds, poly (N-vinylcarbazole) derivatives, aniline copolymers, electrically conductive oligomers such as oligothiophenes, electrically conductive polymers such as polythiophene derivatives, polyphenylene derivatives, polyphenylenevinylene derivatives, polyfluorene derivatives, etc.

The host compounds may be used alone or in combination. The content of the host compound in the light-emitting layer is preferably 0 to 99.9% by mass, more preferably 0 to 99.0% by mass.

As other components in the light-emitting layer used in the present invention, electrically inactive polymer binders may be used if necessary. Examples of the electrically inactive polymer binders include polyvinyl chloride, polycarbonates, polystyrene, polymethyl methacrylate, polybutyl methacrylate, polyesters, polysulfones, polyphenylene oxide, polybutadiene, hydrocarbon resins, ketone resins, phenoxy resins, polyamides, ethyl cellulose, polyvinyl acetate, ABS resins, polyurethanes, melamine resins, unsaturated polyesters, alkyd resins, epoxy resins, silicone resins, polyvinyl butyral, polyvinyl acetal, etc. The light-emitting layer containing a polymer binder is advantageous to be formed with a large area by the wet film-forming method.

(C) Other Organic Layer

The light-emitting device of the present invention may be provided with other organic layers, if necessary. For instance, a hole-injecting layer and a hole-transporting layer may be inserted between the anode and the light-emitting layer, and an electron-transporting layer and an electron-injecting layer may be inserted between the light-emitting layer and the cathode. The above hole-transporting materials may be used for the hole-transporting layer and the hole-injecting layer, and the above electron-transporting materials may be used for the electron-transporting layer and the electron-injecting layer.

(D) Formation of Organic Layer

The organic layer may be formed by any of dry film-forming methods such as a vapor deposition method and a sputtering method; wet film-forming methods such as a dipping method, a spin coating method, a dip-coating method, a casting method, a die-coating method, a roll-coating method, a bar-coating method and a gravure-coating method; transferring methods; and printing methods.

Among them, the wet film-forming methods are advantageous in that they can easily form a large-area, organic compound layer, thereby efficiently providing the light-emitting device with high luminance and excellent light emission efficiency at a low cost. The film-forming methods may be appropriately selected depending on the materials of the organic layer. In the case of the wet film-forming methods, drying is properly carried out after the formation of film layers. Though the drying conditions are not particularly restrictive, such conditions as temperature, etc. are preferably selected such that coated layers are not damaged.

When the organic layer is formed by a wet film-forming method, a binder resin may be added to the organic layer. Examples of the binder resins include polyvinyl chloride, polycarbonates, polystyrene, polymethyl methacrylate, polybutyl methacrylate, polyesters, polysulfones, polyphenylene oxide, polybutadiene, hydrocarbon resins, ketone resins, phenoxy resins, polyamides, ethyl cellulose, polyvinyl acetate, ABS resins, polyurethanes, melamine resins, unsaturated polyesters, alkyd resins, epoxy resins, silicone resins, polyvinyl butyral, polyvinyl acetal, etc. The binder resins may be used alone or in combination.

When the organic layer is formed by a wet film-forming method, solvents used for the preparation of coating liquids by dissolving materials for the organic layer are not particularly restrictive, but may be properly selected depending on the types of the hole-transporting materials, the ortho-metallated complexes, the host materials, the polymer binders, etc. Examples of the solvents include halogen solvents such as chloroform, tetrachloromethane, dichloromethane, 1,2-dichloroethane and chlorobenzene; ketone solvents such as acetone, methyl ethyl ketone, diethyl ketone, n-propyl methyl ketone and cyclohexanone; aromatic solvents such as benzene, toluene and xylene; ester solvents such as ethyl acetate, n-propyl acetate, n-butyl acetate, methyl propionate, ethyl propionate, y-butyrolactone and diethyl carbonate; ether solvents such as tetrahydrofuran and dioxane; amide solvents such as dimethylformamide and dimethylacetamide; dimethylsulfoxide; water; etc.

The percentages of solid components in the coating liquid are not particularly restrictive, and the viscosity of the coating liquid may be properly selected depending on the wet film-forming method used.

Mixing and dissolving of one layer to the next one can be avoided by using the transferring method, thereby efficiently providing multi-layer organic layers. The transferring method is a method comprising using a plurality of transfer materials each composed of an organic layer formed on a temporary support, and transferring each organic layer onto a substrate by a peeling transfer method. The peeling transfer method comprises the steps of heating and/or pressing the transfer material to soften the organic layer, which is adhered to a receiving surface of the substrate, and peeling the temporary support so that only the organic layer remains on the receiving surface. Heating means and pressing means may be the same as those used in the laminating methods.

(f) Other Layers

The other layers are not restrictive, and may be properly selected depending on the purposes. It may be, for instance, a protective layer. Preferable examples of the protective layer are described in JP 7-85974 A, JP 7-192866 A, JP 7-22891 A, JP 10-275682 A, JP 10-106746 A, etc. The shape, size and thickness of the protective layer may be properly selected. The protective layer may be made of any materials that can prevent degrading substances such as water and oxygen from entering or penetrating into the light-emitting device. Silicon monoxide, silicon dioxide, germanium monoxide, germanium dioxide, etc. may be used for the protective layer.

Though not restrictive, the protective layer may be formed by a vacuum deposition method, a sputtering method, an activated sputtering method, a molecular beam epitaxy (MBE) method, a cluster ion beam method, an ion-plating method, a plasma polymerization method, a plasma CVD method, a laser CVD method, a thermal CVD method, a coating method, etc.

Light can be emitted from the light-emitting device of the present invention by applying DC voltage of usually 2 to 40 V, which may contain an AC component, if necessary, or DC current between the anode and the cathode. With respect to the driving method of the light-emitting device of the present invention, methods described in JP 2-148687 A, JP 6-301355 A, JP 5-29080 A, JP 7-134558 A, JP 8-234685 A, JP 8-241047 A, U.S. Pat. Nos. 5,828,429, 6,023,308, Japanese Patent 2784615, etc. may be utilized.

The present invention will be explained in further detail by Examples below without intention of restricting the scope of the present invention defined by the claims attached hereto.

EXAMPLE 1

Production of light-emitting device (cathode substrate/water- and/or oxygen-absorbing layer/cathode/electron-transporting layer/light-emitting layer//hole-transporting layer/anode/anode substrate)

(A) Production of Laminate A (Cathode Substrate/Water- and/or Oxygen-absorbing Layer/Cathode/Electron-transporting Layer)

A 50-µm-thick polyimide sheet (UPILEX-SOS, available from Ube Industries, Ltd.) is laminated onto both surfaces of a 30-µm-thick Al foil, and the resultant laminate was cut to a cathode substrate of 25 mm×25 mm. This cathode substrate was washed with isopropyl alcohol (IPA) in a washing vessel and then subjected to an oxygen plasma treatment. With a patterned vapor deposition mask for a light-emitting area of 5 mm×5 mm placed on the cathode substrate, SiO was vapor-deposited onto the cathode substrate in a reduced-pressure atmosphere of about 0.1 mPa to form a water- and/or oxygen-absorbing layer having a thickness of 0.1 µm. Next, Al was vapor-deposited onto the water- and/or oxygen-absorbing layer in a reduced-pressure atmosphere of about 0.1 mPa to form a 0.2-µm-thick cathode. Further, as an electron-injecting material, LiF was vapor-deposited onto the Al layer in the same pattern as that of the Al layer to form an electron-injecting layer having a thickness of 3 nm. After removing the above mask, an electron-transporting material represented by the structural formula:

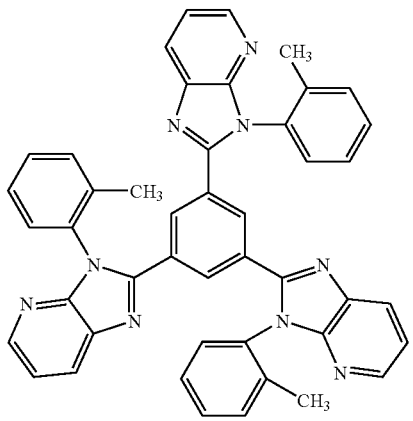

was vapor-deposited onto the electron-injecting layer in a reduced-pressure atmosphere of about 0.1 mPa to form an electron-transporting layer having a thickness of 36 nm.

(B) Production of Laminate B (Cathode Substrate/Water- and/or Oxygen-absorbing Layer/Cathode/Electron-transporting Layer/Light-emitting Layer)

Spin-coated onto one side of a 188-pm-thick temporary support made of polyether sulfone available from Sumitomo Bakelite Co., Ltd. was a coating solution for a light-emitting, organic thin-film layer having a composition of 40 parts by mass of polyvinyl carbazole having Mw of 63,000 available from Aldrich Chemical Co., 1 part by mass of tris (2-phenylpyridine) iridium complex (ortho-metallation complex) and 3,200 parts by mass of dichloroethane. The coated liquid was dried at room temperature to form the light-emitting layer in a thickness of 40 nm on the temporary support. This light-emitting layer formed on the temporary support was overlapped with the electron-transporting layer of Laminate A, and caused to pass through a pair of rollers both heated at 160° C. at pressure of 0.3 mPa and at a speed of 0.05 m/minute. The temporary support was peeled to transfer the light-emitting layer onto the electron-transporting layer of Laminate A, thereby providing Laminate B.

(C) Production of Laminate C (Anode Substrate/Anode/Hole-transporting Layer)

A glass plate of 0.7 mm×25 mm×25 mm as an anode substrate was placed in a vacuum chamber, to form an anode thereon by DC magnetron sputtering using an ITO target under the conditions that the substrate was at a temperature of 250° C., and that an oxygen pressure was $1\times10^{-3}$ Pa. The ITO target contained 10% by mass of $SnO_2$ with an indium/tin molar ratio of 95/5. The anode of a thin ITO film had a thickness of 0.2 µm and a surface resistance of 10 Ω/square. The anode substrate provided with the anode was washed with isopropyl alcohol in a washing vessel, and then subjected to an oxygen plasma treatment. The oxygen-plasma-treated, transparent electrode was spin-coated with a coating solution having a composition of 40 parts by mass a hole-transporting compound (PTPDES) represented by the structural formula:

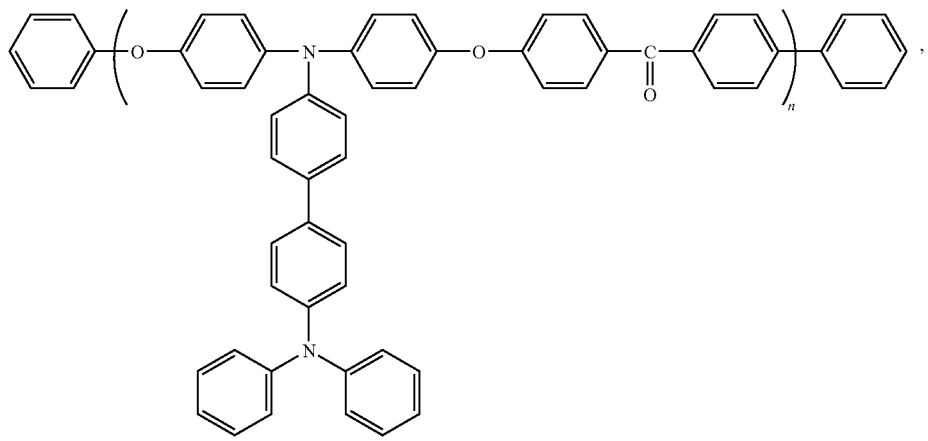

10 parts by mass of an additive (TBPA) represented by the structural formula:

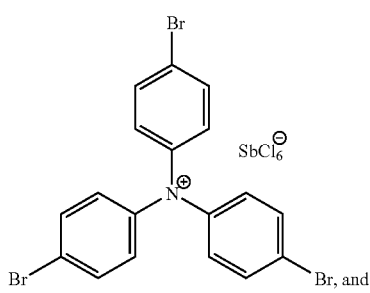

3,200 parts by mass of dichloroethane. The coated liquid was dried at room temperature to form a hole-transporting layer in a thickness of 100 nm. Laminate C was thus obtained.

(D) Production of Light-emitting Device (Cathode Substrate/Water- and/or Oxygen-absorbing Layer/Cathode/Electron-transporting Layer/Light-emitting Layer//Hole-Transporting Layer/Anode/Anode Substrate)

Laminates B and C were overlapped such that the light-emitting layer of Laminate B faced the hole-transporting layer of Laminate C, and caused to pass through a pair of rollers both heated at 160° C. at pressure of 0.3 mPa and at a speed of 0.05 m/minute to be laminated to each other to produce the light-emitting device of the present invention.

(E) Evaluation of Light-emitting Device

The light-emitting device produced in (D) was evaluated by the following method. DC voltage was applied to each organic EL device by Source-Measure Unit 2400 available from Toyo Corporation to cause light emission. $L_{max}$ represents the maximum luminance obtained by this test, and $V_{max}$ represents voltage when $L_{max}$ was obtained. The light-emitting efficiency ($\eta_{200}$) at 200 cd/m² was measured. $L_{max}$, $V_{max}$ and $\eta_{200}$ after storage for 30 days under the conditions of 95° C. and 95% RH were also measured.

EXAMPLE 2

A light-emitting device was produced and evaluated in the same manner as in Example 1 except for using GeO as a material for a water- and/or oxygen-absorbing layer.

EXAMPLE 3

A light-emitting device was produced and evaluated in the same manner as in Example 1 except for using SnO as a material for a water- and/or oxygen-absorbing layer.

EXAMPLE 4

A light-emitting device was produced and evaluated in the same manner as in Example 1 except for using FeO as a material for a water- and/or oxygen-absorbing layer.

EXAMPLE 5

A light-emitting device was produced and evaluated in the same manner as in Example 1 except for using Ca having a work function of 3.0 eV as a material for a water- and/or oxygen-absorbing layer.

EXAMPLE 6

A light-emitting device was produced and evaluated in the same manner as in Example 1 except for using Li having a work function of 2.9 eV as a material for a water- and/or oxygen-absorbing layer.

COMPARATIVE EXAMPLE 1

A light-emitting device was produced and evaluated in the same manner as in Example 1 except that a water- and/or oxygen-absorbing layer was not formed.

Table 1 shows $L_{max}$, $V_{max}$ and $\eta_{200}$ of each light-emitting device of Examples 1 to 6 and Comparative Example 1. The light-emitting device of Comparative Example 1 had more dark spots, lower external quantum efficiency and poorer durability than those of Examples 1 to 6.

TABLE 1

| Light-Emitting Device | | $L_{max}$ (cd/m²) | $V_{max}$ (V) | $\eta_{200}$ (%) |
|---|---|---|---|---|
| Example 1 | At start | 52,000 | 12 | 13.1 |
|  | After 30 days | 47,000 | 12 | 11.7 |
| Example 2 | At start | 51,000 | 12 | 12.9 |
|  | After 30 days | 45,000 | 12 | 11.5 |
| Example 3 | At start | 48,000 | 12 | 13.0 |
|  | After 30 days | 42,000 | 12 | 11.1 |

TABLE 1-continued

| Light-Emitting Device | | $L_{max}$ (cd/m$^2$) | $V_{max}$ (V) | $\eta_{200}$ (%) |
|---|---|---|---|---|
| Example 4 | At start | 49,000 | 12 | 13.2 |
| | After 30 days | 42,000 | 12 | 10.9 |
| Example 5 | At start | 55,000 | 12 | 13.5 |
| | After 30 days | 50,000 | 12 | 12.0 |
| Example 6 | At start | 56,000 | 12 | 13.4 |
| | After 30 days | 49,000 | 12 | 11.8 |
| Comparative Example 1 | At start | 41,000 | 12 | 10.4 |
| | After 30 days | 12,000 | 19 | 6.1 |

As described above in detail, the light-emitting device of the present invention is free from the conventional problems that water intrudes into the device without suffering from increase in a sealed space. In addition, because the light-emitting device of the present invention has a bonding structure of partial laminates, it has high interlayer adhesion. Accordingly, it has excellent durability with few defects such as dark spots. The method for producing the light-emitting device of the present invention can produce large-area, light-emitting devices easily by simple steps.

What is claimed is:

1. A light-emitting device comprising in order an anode substrate, an anode, at least one organic layer comprising a light-emitting layer and further comprising at least one polymer, a cathode, at least one water- and oxygen-absorbing layer having a thickness in the range 10 nm to 1 μm and consisting essentially of a reducing metal oxide, and a cathode substrate, wherein said water- and oxygen-absorbing layer is formed directly adjacent to said cathode, wherein the reducing metal oxide is an oxide in which an atom bonded to oxygen has a smaller oxidation number than its valency.

2. The light-emitting device of claim 1, wherein the reducing metal oxide is at least one selected from the group consisting of SiO, GeO, SnO, FeO, MnO and WO.

3. The light-emitting device of claim 2, wherein the reducing metal oxide is at least one selected from the group consisting of SiO, GeO, SnO and FeO.

4. The light-emitting device of claim 1, wherein at least one water- and oxygen-absorbing layer has a thickness in the range 50 nm to 500 nm.

5. The light-emitting device of claim 1, wherein at least one water- and oxygen-absorbing layer is composed of a plurality of layers.

6. The light-emitting device of claim 1, wherein said at least one water- and oxygen-absorbing layer is formed by a vapor deposition method or a sputtering method.

7. The light-emitting device of claim 1, wherein said at least one water- and oxygen-absorbing layer comprises a single layer of silicon oxide having a thickness of 0.1 μm.

8. The light-emitting device of claim 7, wherein said cathode is a 0.2-μm-thick layer of aluminum deposited directly on said silicon oxide layer.

9. A light-emitting device comprising in order an anode substrate, an anode, at least one organic layer comprising a light-emitting layer and further comprising at least one polymer, a cathode, at least one water- and oxygen-absorbing layer consisting of a reducing metal oxide and having a thickness in the range 10 nm to 1 μm, and a cathode substrate, wherein said water- and oxygen-absorbing layer is formed directly adjacent to said cathode, wherein the reducing metal oxide is an oxide in which an atom bonded to oxygen has a smaller oxidation number than its valency.

10. A light-emitting device comprising in order an anode substrate, an anode, at least one organic layer comprising a light-emitting layer and further comprising at least one polymer, a cathode, at least one water- and oxygen-absorbing layer comprising a reducing metal oxide and having a thickness in the range 10 nm to 1 μm, and a cathode substrate, wherein said water- and oxygen-absorbing layer is formed directly adjacent to said cathode, wherein the reducing metal oxide is an oxide in which an atom bonded to oxygen has a smaller oxidation number than its valency.

* * * * *